United States Patent [19]

Pittman

[11] 4,093,330

[45] June 6, 1978

[54] CIRCUIT CHIP RECEPTACLE

[75] Inventor: Robert B. Pittman, River Edge, N.J.

[73] Assignee: Industrial Electronic Hardware, New York, N.Y.

[21] Appl. No.: 797,015

[22] Filed: May 16, 1977

[51] Int. Cl.[2] ............................................ H05K 1/12

[52] U.S. Cl. .......................... 339/17 CF; 339/210 M

[58] Field of Search ....... 339/17 CF, 176 MP, 206 R, 339/210 R, 210 M

[56] References Cited

U.S. PATENT DOCUMENTS

| | | | |
|---|---|---|---|
| 3,732,529 | 5/1973 | Weisenburger ................ | 339/17 CF |
| 3,753,211 | 8/1973 | Pauza et al. .................... | 339/17 CF |

*Primary Examiner*—Neil Abrams

*Attorney, Agent, or Firm*—James & Franklin

[57] ABSTRACT

A receptacle for a circuit chip having a plurality of exposed connection pads spaced from one another comprises a support body, a plurality of contact members adapted to be associated with the receptacle, a contact-holding element, and a contact-retaining element. Each contact member has a first stop part engaging the receptacle from one direction, thereby limiting the degree to which the contact member can move in that direction, and a second stop part engaging the contact-retaining element from the opposite direction, thereby limiting the degree to which the contact member can move in that direction. The contact-retaining element is removably mounted on the support body so that, after removal thereof, a single defective contact member may be removed from the support body for replacement without disturbing the other contact members.

40 Claims, 12 Drawing Figures

A
B
C
D
E
5
6
10
11
12
14
19
24
32
38
40
51
52
58
62
66
72
76
80
82
88
92
C'
C"

FIG. 9
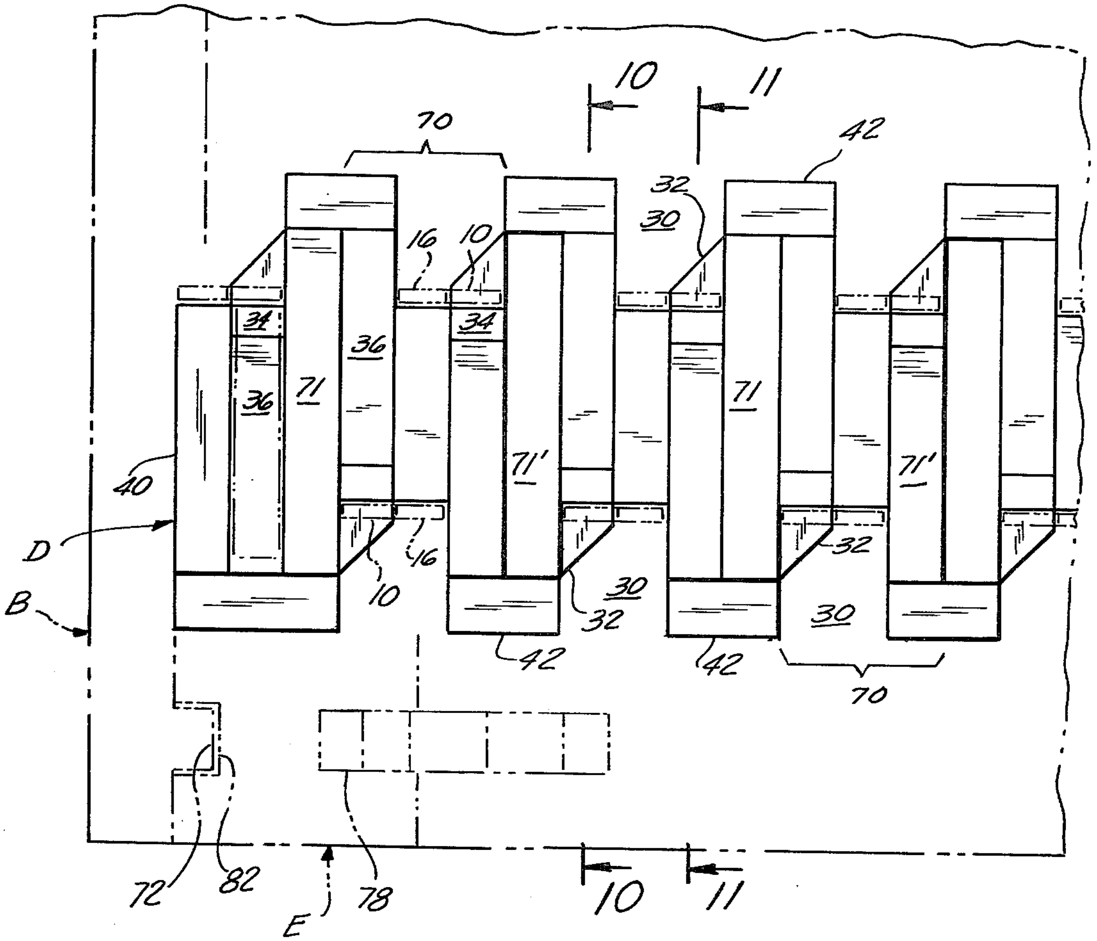
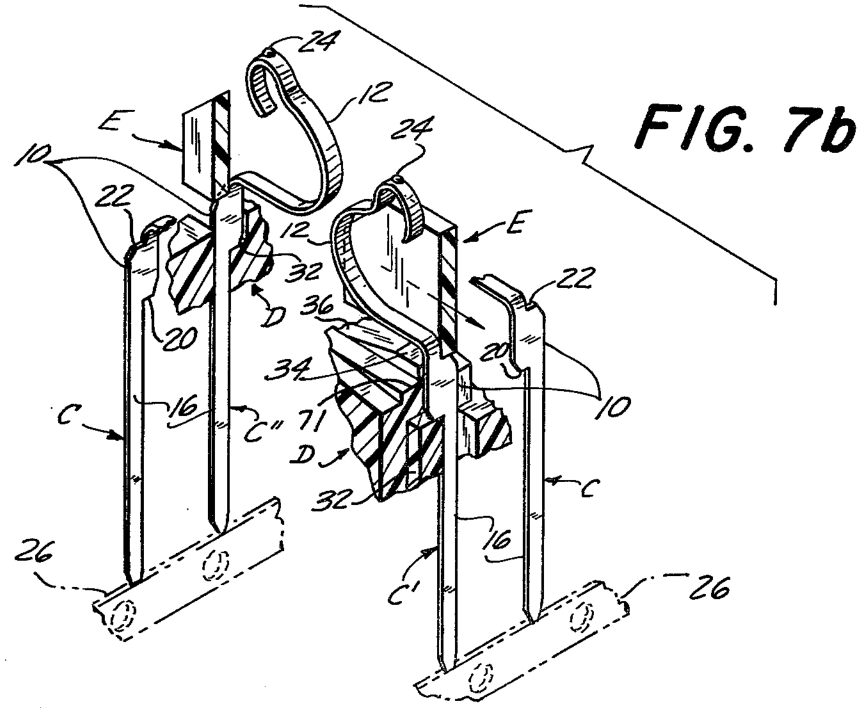
FIG. 7b

CIRCUIT CHIP RECEPTACLE

BACKGROUND OF THE INVENTION

The present invention relates to a receptacle for a circuit chip having a plurality of exposed connection pads spaced from one another, and more particularly to a receptacle adapted to connect such connection pads to contact members adapted for the making of an external connection thereto.

Typically circuit chips (such as integrated circuit and semiconductor chips) have a plurality of exposed connection pads spaced from one another, the connection pads being disposed on one face of the chip, frequently in two laterally extending parallel series, each series being on an opposite side of the chip face. In order to physically support the chip and facilitate the making of electrical connections between the connection pads thereof and an external circuit, the chip is customarily mounted on a receptacle. A typical receptacle includes a plurality of contact members in very close spatial disposition, one end of each contact member being adapted to abut against a respective connection pad when the chip is in place on one face of the receptacle and the other end of each contact member extending from the opposed face of the receptacle for connection to an external circuit, for example, a printed circuit board.

The known receptacles are not entirely satisfactory for a number of reasons. In the first place, once the contact members have been connected to the external circuit, for example, by soldering the ends thereof to a printed circuit board, failure of a single contact member has necessitated the disconnection of each and every contact member from the external circuit, and then, after replacement of the defective contact member, re-soldering of all the contact members once again to the printed circuit board. Other disadvantages of the known receptacles are their failure to provide adequate insulative compartmentalization of each contact member to preclude the formation of short circuits therebetween, the inability of the receptacles to provide a large number of closely spaced contact members within a given limited area to meet the requirements of a chip having closely spaced connection pads (except by resort to very narrow contact members which introduce problems of their own), the need to use contact members of different configurations and dimensions in a single receptacle (thereby increasing the cost of manufacturing and the complexity of assembling the device), etc.

Accordingly, it is an object of the present invention to provde a receptacle in which a defective contact member can be replaced without disturbing the connections of the other contact members to the external circuit.

It is another object to provide such a receptacle in which the contact members may be very closely spaced, and yet sufficiently compartmentalized to preclude the formation of short circuits therebetween.

It is still another object to provide such a receptacle in which all of the contact members are of identical configuration and dimensions.

It is a further object to provide such a receptacle which is relatively inexpensive and easy to manufacture and assemble, yet compact, sturdy and durable in use.

SUMMARY OF THE INVENTION

It has now been found that the above and related objects may be obtained in a receptacle for a circuit chip having a plurality of exposed connection pads spaced from one another comprising a support body, a plurality of contact members adapted to be associated with the receptacle, a contact holding-element secured to the body, and a contact-retaining element mounted on the body. The support body has opposed faces, with a chip-receiving station disposed on one face thereof. An aperture extends through the body to the other face thereof from the chip-receiving station, the aperture being in the vicinity of the chip-carried connection pads when the chip is at the chip-receiving station. The contact-holding element is secured to the body and defines a plurality of spaced contact-receiving first passages in communication with the aperture.

A plurality of contact members are provided, each contact member having a first portion, a second portion and a third portion. The first contact portion extends at least partially through a first contact-receiving passage of the contact-holding element. The second contact portion extends from the first contact portion to the one face of the support body and is there exposed at the chip-receiving station to engage and make electrical connection with a given one of the chip-carried connection pads. The third contact portion extends from the first contact portion to the other face of the support body and is there exposed for the making of an external connection thereto.

The contact-retaining element is mounted on the body at the one body face thereof and has second passages in which the second contact portions are received.

Each contact member has a first stop part which engages the receptacle (preferable the contact-holding element) from the direction of the one body face, thereby limiting the degree to which the contact member can move towards the other body face. Each contact member also has a second stop part engaging the contact-retaining element from the direction of the other body face, thereby limiting the degree to which the contact member can move towards the one body face. Thus, as the first and second stop parts are disposed on the first contact portion, when the receptacle is in ordinary use the first contact portion of each contact member is restrained against movement toward either body face.

In a preferred aspect of the present invention the contact-holding element is received within the support body aperture. The contact-holding element has a plurality of laterally extending recesses, while the support body has a plurality of projections extending laterally into the aperture and received within the recesses respectively. The recesses are larger than the projections so that the first contact-receiving passages are defined by the spaces between the projections and the recesses. On the other hand, the recesses are only slightly larger than the projections so that the first contact portions are snugly received in the first passages. Preferably the first stop part comprises a downwardly facing surface of the contact member (preferably the first contact portion thereof), and the second stop part comprises an upwardly facing surface of the contact member (preferably the first contact portion thereof).

In order to enable removal of a contact member from the receptacle, the contact-retaining element is removably mounted on the support body. The second passages of the contact-retaining element extend toward the chip-receiving station of the support body, with the second contact portions being received in the second passages and there movable in a first direction in which the second passages extend. The second contact portions are relatively snugly received in the second passages in a second direction at right angles to the first direction, thereby providing lateral support to the second contact portions. Preferably the contact-retaining element defines at least in part the chip-receiving station, with the second passages terminating at and being exposed at the chip-receiving station.

In another preferred aspect of the present invention the contact-holding element has a plurality of recesses on each of a pair of opposite sides thereof, the first passages on one side being at least partially laterally offset from the first passages on the opposite side. In this case the second and third contact portions extend from the first contact portion in laterally staggered orientation with the first and second stop portions being at least partially aligned longitudinally with the second and third contact portions, respectively. The contact members in the first passages on opposite sides of the contact-holding element have their second portions displaced from their third portions in opposite directions. The second and third contact portions are preferably laterally thinner than the first contact portion, with the second passages being deep enough to receive and accommodate the first contact portions. For the sake of economy of manufacture, the contact members on opposite sides of the contact-holding elements may be of substantially identical configurations and dimensions.

Generally the second and third contact portions extend from the first contact portion in laterally staggered orientation. Preferably the first and second stop portions are at least partially aligned longitudinally with the second and third contact portions, respectively, and the axes of the first and second passages are offset in like manner as the axes of the second and third contact portions.

The construction of the receptacle enables a defective contact member to be replaced simply by removing the chip and the contact-retaining element from the support body, unsoldering the defective contact member and replacing it, resoldering the replacement to the external circuit, and reinserting both the contact-retaining element and the chip into their original position, all without disturbing in any way the other contact members.

BRIEF DESCRIPTION OF THE DRAWING

FIG. 7B is a fragmentary isometric view, to a greatly enlarged scale and partially in cross-section, of the contact members with fragmentary portions of certain other elements of the receptacle being shown for the purposes of illustrating the relationships therebetween;

FIG. 9 is a fragmentary top plan view, to a greatly enlarged scale, of the contact-holding element, with other elements of the receptacle being illustrated in phantom line;

DETAILED DESCRIPTION OF THE PREFERRED EMBODIMENTS

Figure 1:
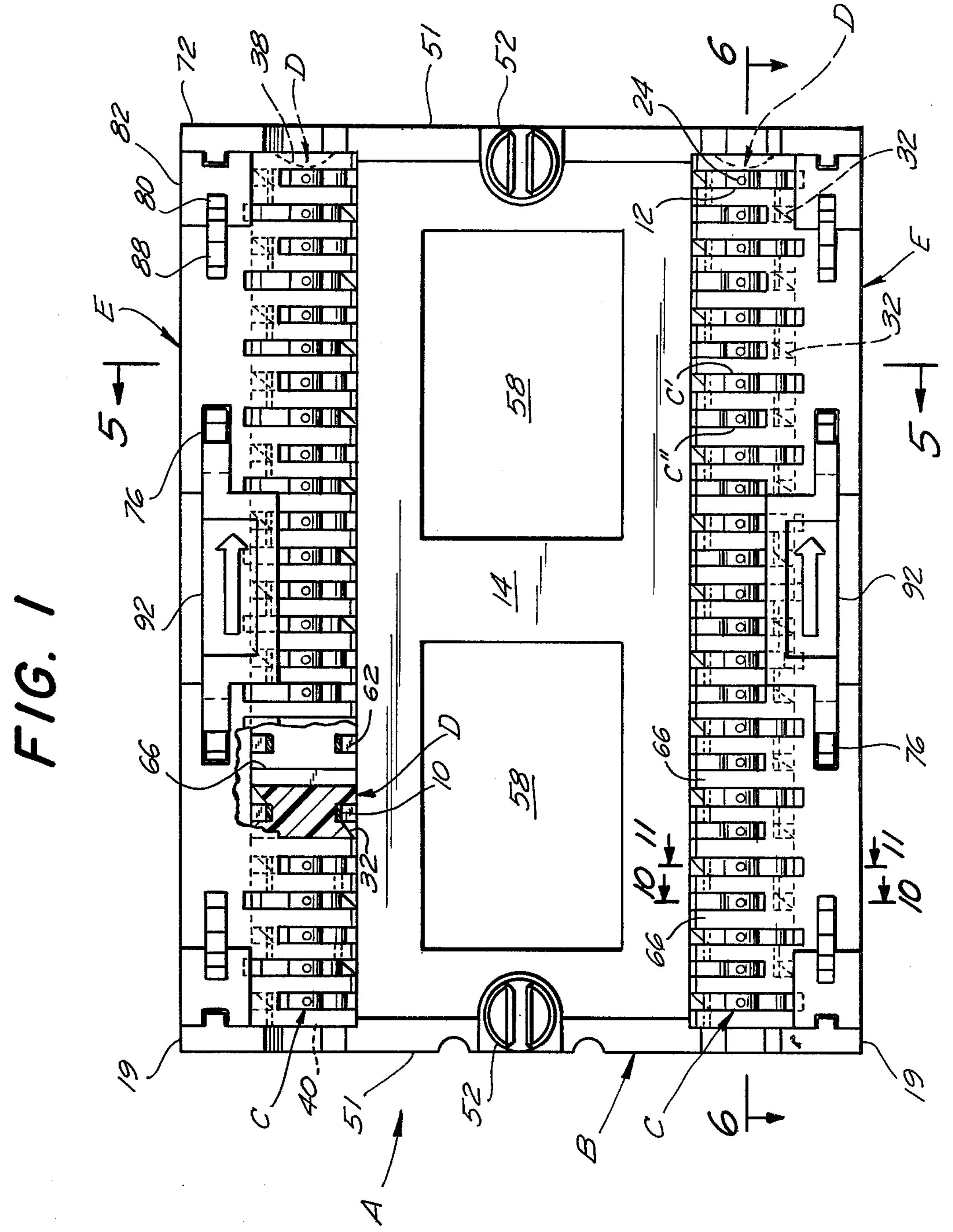
FIG. 1 is a top plan view of a chip receptacle according to the present invention, with portions thereof cutaway to reveal the details of internal construction.

Referring now to the drawing, and in particular to FIG. 1 thereof, therein illustrated is a receptacle A according to the present invention and adapted to receive a chip (e.g., an integrated circuit chip) having a plurality of exposed connection pads spaced from one another. Broadly speaking, the receptacle A comprises a support body B, a plurality of contact members C, a pair of contact-holding elements D secured to the support body A, and a pair of contact-retaining elements E removably mounted on the support body A. The contact-holding elements D limit movement of the contact members C downwardly (that is, below the plane of FIG. 1), while the contact-retaining elements restrain movement of the contact members C upwardly (that is, upwardly from the plane of FIG. 1). Once the contact-retaining elements E are removed from the support body B, individual contact members C may be replaced without disturbing the other contact members C.

Figure 4:
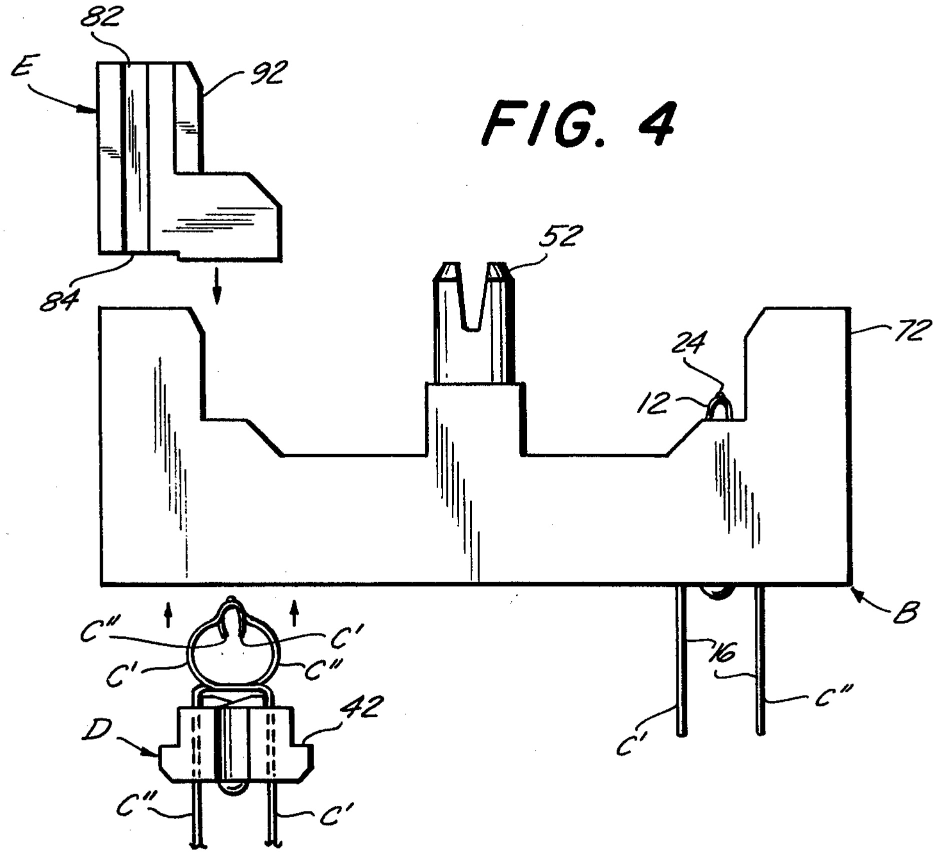
FIG. 4 is a partially exploded end elevation view thereof.
Figure 5:
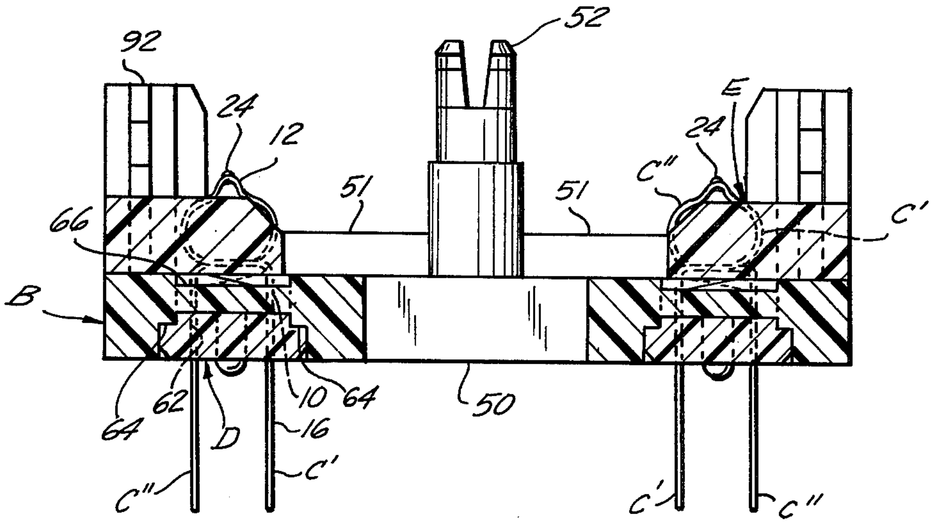
FIG. 5 is an end elevation view thereof, partially in cross-section, taken along the line 5—5 of FIG. 1.
Figure 6:
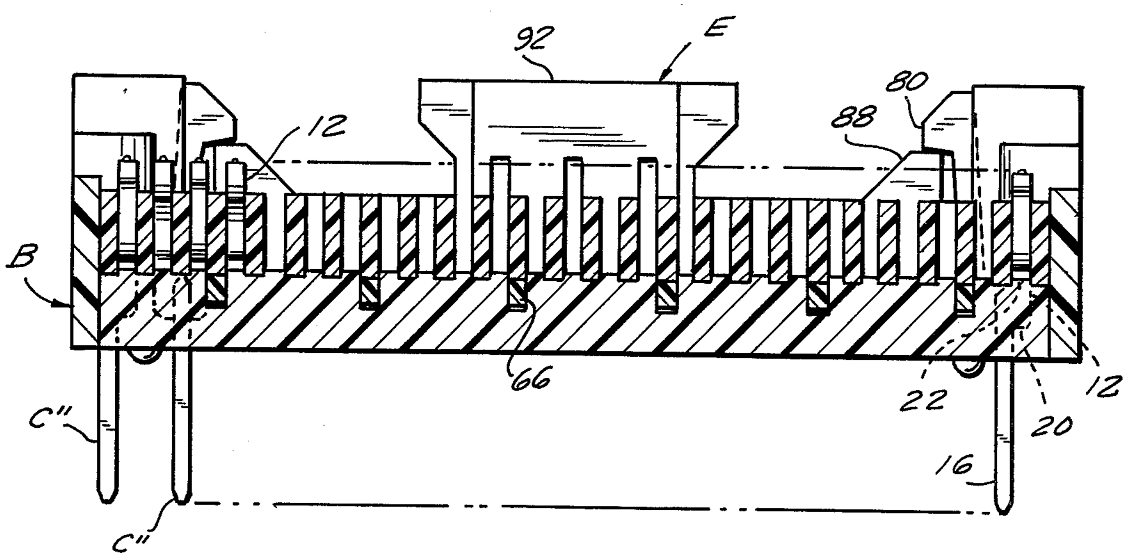
FIG. 6 is a side elevation view thereof, partially in cross-section, taken along the line 6—6 of FIG. 1.

More specifically contact members C (see FIG. 7B) are positioned on either side of contact-holding element D (see FIG. 9) for insertion upwardly into an aperture in support body B (see FIG. 4); after such insertion a contact-retaining element E is downwardly mounted on the support body B. Finally, as shown in FIG. 4, a circuit chip 56 is mounted on the receptacle A, with the chip-carried connection pads abutting the tops of the contact members C, and the bottoms of the contact members C being soldered or otherwise conductively connected to an external circuit, such as printed circuit board 100. Each of the elements of the receptacle A will now be discussed in greater detail.

Figure 2:
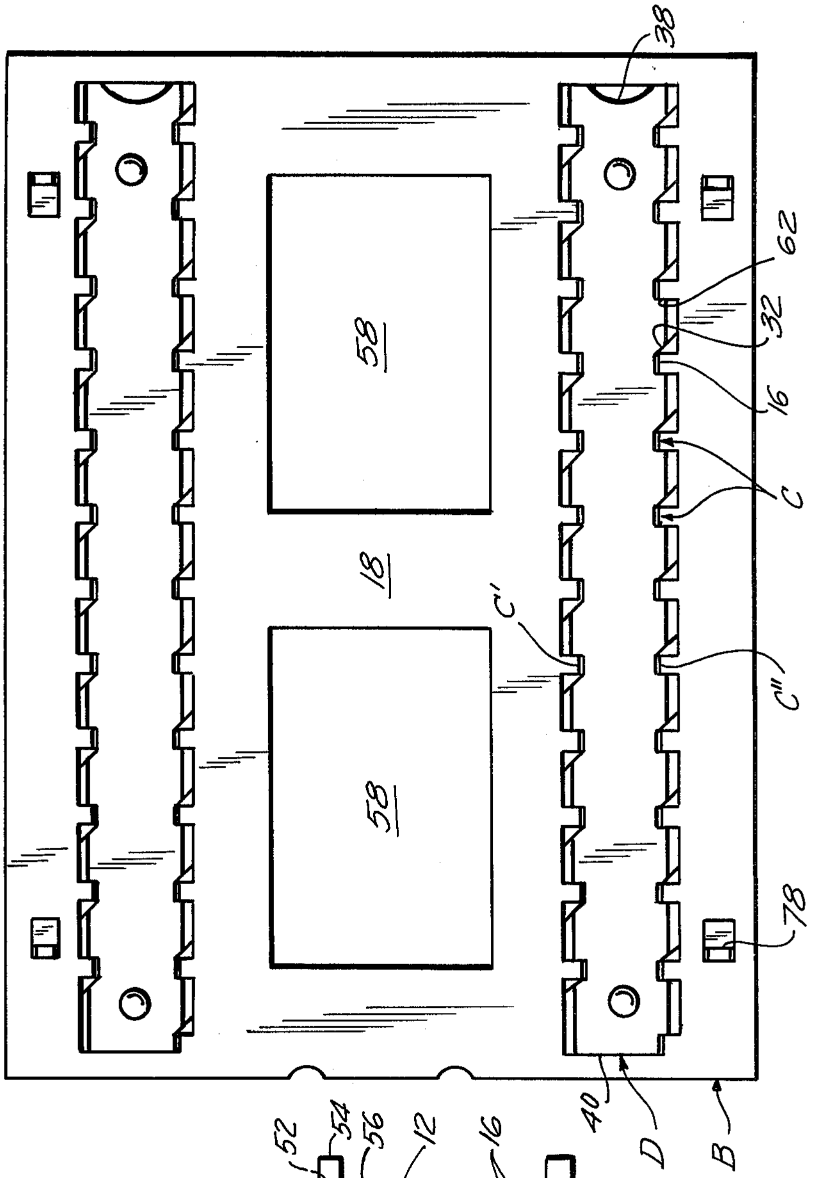
FIG. 2 is a bottom plan view thereof.

Referring now to FIG. 7B in particular, each contact member C is formed of a resilient conductive material, as is common, and has a first contact portion 10 extending at least partially through a passage in the contact-holding element D. A second or upper contact portion 12 extends upwardly from the first contact portion 10 to the top or upper face 14 of the support body B (see FIG. 1) where it is exposed to engage and make electrical connections with a given one of the chip-carried connection pads. A third or lower contact portion 16 extends downwardly from the first contact portion 10 to the bottom or lower face 16 of the support body B (see FIG. 2), where it is exposed for the making of an external electrical connection thereto, for example, to a printed circuit board. The upper and lower contact portions 12 and 16 are laterally thinner than the first or intermediate contact portion 10 and extend from the intermediate contact portion 10 in laterally staggered orientation. Accordingly, the intermediate contact portion 10 has a bottom, downwardly facing ledge or first stop part 20 at least partially aligned with the upper contact portion 12 and an upper, upwardly facing ledge or second stop part 22 at least partially aligned with the bottom contact portion 16.

The upper contact portion 12 extends upwardly from the intermediate contact portion 10 on one side of the contact-holding element D, substantially across with width of the contact-holding element D, and then curves upwardly and back toward the same side of the contact-holding element D, ending in a slightly downwardly curved portion. Atop the uppermost part of the curved portion is a raised teat 24 adapted to make the electrical connection with the chip-carried connection pad. The lower contact portion 16 extends downwardly from the intermediate contact portion 10, the upper portion thereof preferably being disposed in and along an axial passage in the contact-holding element D. During the process of assembling the receptacle, and generally until just before the contact members C are to be connected with the external circuit, the laterally aligned bottom ends of a plurality of contact members C are connected by means of a common bar 26 (indicated in phantom line in FIG. 7B). The purpose of the common bar 26 is to enable the various contact members C to be handled as a unit during assembly of the receptacle A, the common bar being later cut away to free the lower contact portions 16 for individual connection to the external circuit.

Referring now to FIGS. 7 and 9 in particular, the contact-holding element D comprises a longitudinally extending member defining on each side thereof a series of laterally aligned, but laterally spaced, contact-receiving recesses 30. The bottom of each recess 30 is provided with an upwardly facing ledge 32 adapted to abut against the downwardly facing first stop part 20 of a contact member C when the contact member C is properly inserted in the recess 30. The first stop part 20 engages the ledge 32 from the direction of the receptacle top 14, thereby limiting the degree to which the contact member C can move towards the receptacle bottom 18.

It will be noted that the recesses 30 on opposite sides of the contact-holding element D are disposed so that the lower contact portions 16 of opposed contact members C are at least substantially, and preferably completely, transversely aligned, with the intermediate contact portions 10 being laterally offset therefrom in opposite directions. In other words, all of the contact members C to be associated with a given contact-holding element D are identical and have their intermediate contact portions 10 at least partially laterally offset from their lower contact bottom portions 16 in the same direction so that, when two identical contact members C face each other across the contact-holding element D with their lower contact portions 16 transversely aligned, the intermediate contact portions 10 extend therefrom in opposite directions. Accordingly, the present invention eliminates the need for two sets of different contact members C, depending on which side of the contact-holding element D the contact member C was to be placed, and permits the use of identical contact members C originally provided in identical unit-handling assemblies, as shown in FIG. 7B, on both sides of the contact-holding element D, thus reducing the cost of manufacture and simplifying the assembly procedure. Furthermore because the contact-holding element D enables a partial overlap, of the contact members C (and especially the intermediate and lower contact portions 10 and 16), extraordinarily close lateral spacing of the contact members C (and especially the upper contact portions 12) is achievable without the use of very thin, and hence unreliable, contact members C.

The portion of the top surface of the contact-holding element D directly under each second contact portion 12 comprises a raised upper surface 34 and a downwardly inclined surface 36 which permits a limited downward retreat of the upper contact portion 12. As the contact-holding element D is adapted to be received within an aperture in the support body B, the ends 38,40 thereof are preferably somewhat different in configuration to ensure that the contact-holding element D is insertable into the aperture provided only in the correct orientation. For example, end 38 may be substantially arcuate while end 40 is substantially flat (see FIG. 7A). The walls defining the sides of the recess 30 are provided with outwardly extending tabs 42 at the bottom thereof, the tabs 42 being adapted to abut against parts of the support body B and thereby limit the extent to which the contact-holding element D can be pushed upwardly through the aperture in the support body B.

Figure 7A:
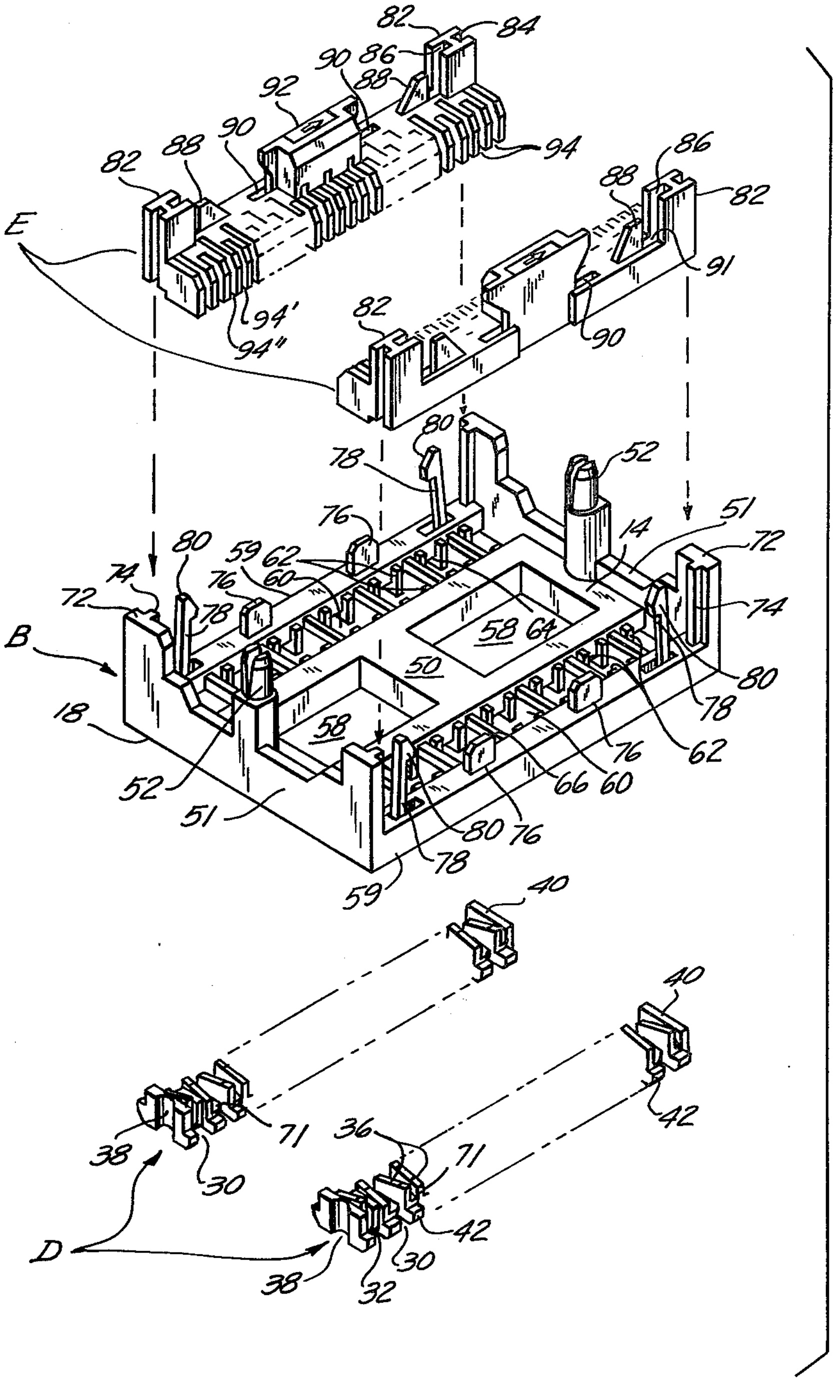
FIG. 7A is an exploded isometric view thereof, to a slightly smaller scale, with the contact members being omitted for the purpose of clarity of illustration.
Figure 11:
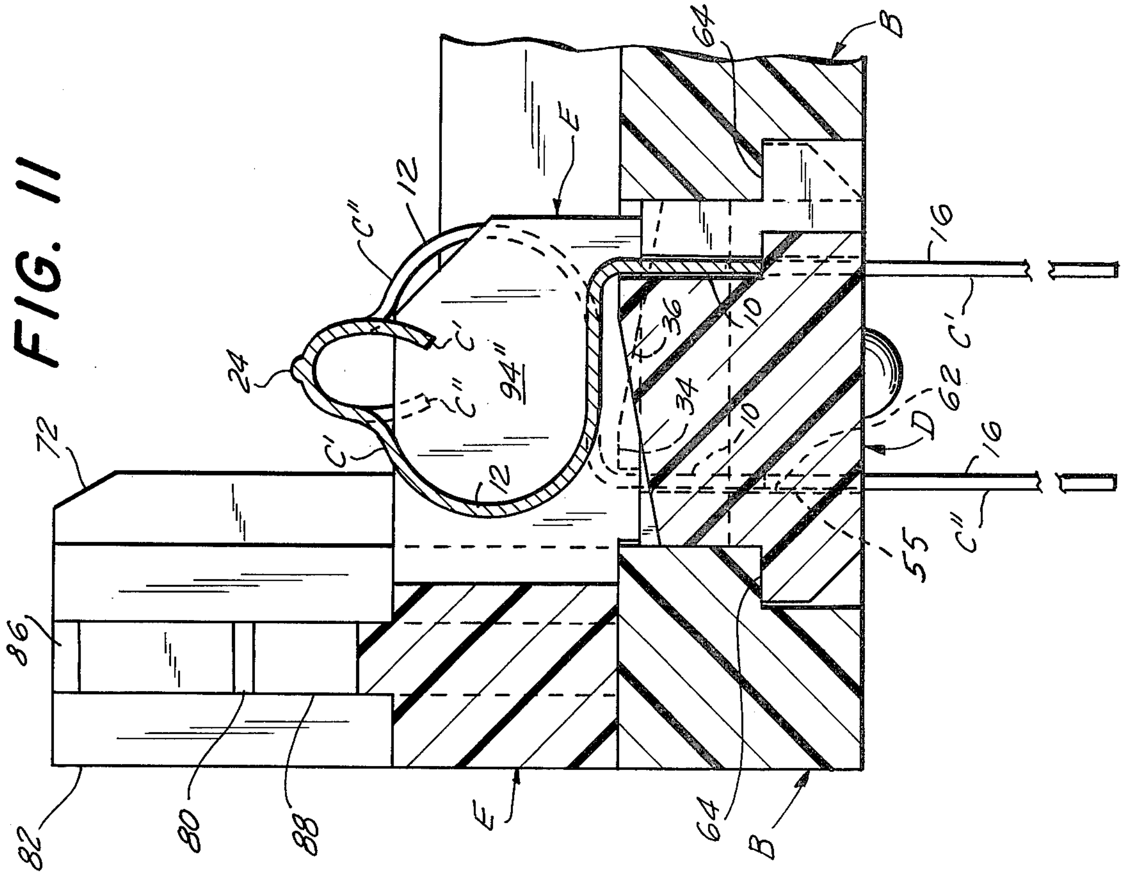
FIG. 11 is a fragmentary end elevation view, partially in cross-section and to a greatly enlarged scale, taken along the line 11—11 of FIG. 1.
Figure 10:
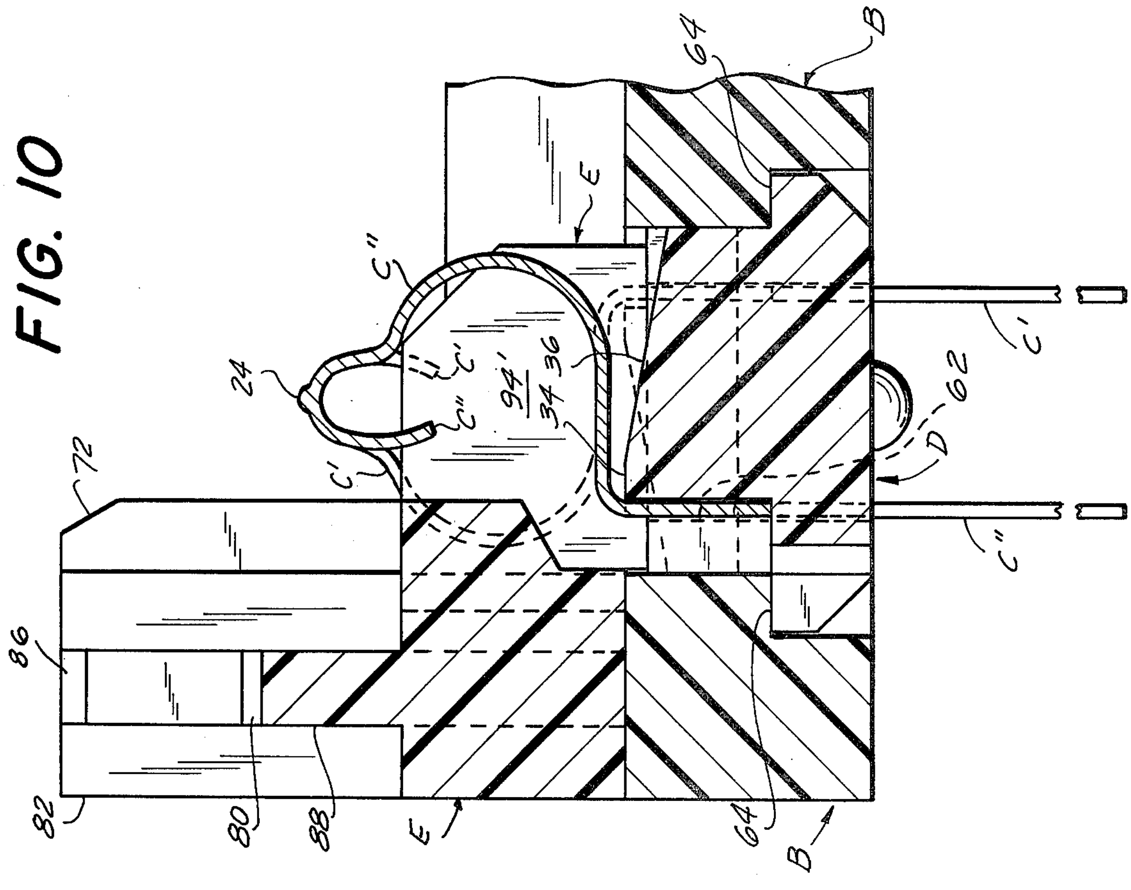
FIG. 10 is a fragmentary end elevation view, partially in cross-section and to a greatly enlarged scale, taken along the line 10—10 of FIG. 1.

Referring now in particular to FIG. 7A, the support body B has an upper face 14, a lower face 18, and is of generally rectangular configuration. A chip-receiving station 50 is located on the upper face 14 spaced slightly inwardly from the sides and ends thereof. In the middle of each end 51 thereof is an upstanding split-end lug 52 adapted to enter a suitable opening in the support plate 54 from which the circuit chip 56 depends (see FIG. 8) and removably mount the chip-carrying plate 54 in the chip-receiving station 50. To reduce the cost and weight of the support body B and especially to promote airflow through the receptacle A, the support body B may be cut out in areas 58 underlying the chip-receiving station 50.

The support body B is provided, adjacent each side 59 thereof, with an aperture 60 extending through the body B to the bottom face 18 from the chip-receiving station 50 (at the top face 14) in the vicinity of the chip-carried connection pads when the chip 56 is at the chip-receiving station 50. Each aperture 60 is provided on each side thereof with a plurality of laterally extending projections 62 adapted to be received within the recesses 30 of the contact-holding element D. The recesses 30 are wider and deeper than the projections 62, the space between each projection 62 and its associated recess 30 comprising a passage 55 communicating with the aperture 60 and adapted to receive a contact member C, and more particularly, the first portion 10 thereof.

Each aperture 60 is of greater width adjacent the bottom support face 18 than adjacent the top support face 14, thus forming a downwardly facing ledge 64. When the contact-holding element D is inserted into the aperture 60 from the bottom of the support body B, the upwardly facing surfaces of the tabs 42 of the contact-holding element D abut against the downwardly facing ledge 64 of the support body B, thus limiting the extent to which the contact-holding element D can be pushed through the support body B. Generally the ledge 64 is so positioned as to ensure that the bottom of the contact-holding element D forms a substantially flush surface with the support body bottom 18.

To compensate for the potential loss of structural strength in the support body B due to the provision of recesses 60, where that is desirable, a plurality of laterally spaced strengthening members 66 may extend transversely across each aperture 60. To understand where these strengthening members 66 are disposed, it is helpful to consider three adjacent parallel transverse planes of the contact-holding element D (in FIG. 9) as constituting a repeating unit 70. The center plane of each unit 70 is adapted to receive two transversely aligned lower contact portions 16 (shown in phantom) and the two outer planes are each adapted to receive an upper contact portion 12 (shown in phantom). The repeating units 70 are laterally separated by transversely extending segments 71, and the strengthening members 66 may be disposed so as to overlie segments 71. Generally sufficient strengthening is achievable with strengthening members 66 overlying only alternate segments 71' as shown in the drawing.

The support body B further includes at each corner an upstanding post 72 including an upwardly extending ridge 74 projecting parallel to the long axis of and in the direction of the aperture 60. Each side of the body support B further includes a pair of laterally spaced upstanding stubs 76 and, intermediate each ridge 74 and stub 76 set, a resilient catch member 78 having a head 80 at the top thereof facing the associated adjacent stub 76.

The contact-retaining element E has at each end thereof an upstanding H-shape post 82 defining an upwardly extending outer groove 84 and an upwardly extending inner groove 86. Each contact-retaining element E further includes, laterally aligned with grooves 84,86, an upwardly projecting stub 88 adjacent to, but laterally spaced from, each inner channel 86, a vertical slot 90 therethrough laterally spaced inwardly from each stub 88, and a vertical slot 91 therethrough intermediate each stub 88 and inner channel 86 set, the vertical slot 91 communicating with the associated adjacent inner channel 86. The post 82, stubs 88 and slots 90,91 of the contact-retaining element E are so configured and dimensioned relative to the post 72, catch members 78 and stubs 76 of the body support B, that ridges 74 are received within outer grooves 84, catch members 78 are received in slots 91 and inner grooves 86, and stubs 76 are received in slots 90. During the process of inserting the contact-retaining element E on the body support B each resilient catch member 78 becomes displaced toward its associated adjacent ridge 74 by slot 91 and stub 88, until the head 80 thereof clears the top of stub 88, at which point the natural resiliency of the catch member 78 causes it to return to its original position with the head 80 overlying the top of the stub 88. In order to dismount the contact-retaining element E from the support body B, it is only necessary to displace the catch members 78 (and in particular the heads 80 thereof) towards the ridges 74 and pull upwardly on the handle 92 provided at the center of each contact-retaining element E.

The side of the contact-retaining element E adjacent to, and indeed forming a part of, the chip-receiving station 50 is provided with a plurality of laterally spaced passages 94 extending vertically therethrough, opening onto the center of the chip-receiving station 50, and adapted to receive the upper contact portions 12. Long passages 94' are in alternating sequence with short passages 94'', the short passages 94' being adapted to receive the upper contact portions 12 of contact members C' having their lower contact portions 16 disposed in an inner row (i.e., adjacent openings 58) and the long passages 94'' being adapted to receive the upper contact portions 12 of contact members C'' having their lower contact portions 16 disposed in an outer row (i.e., adjacent body sides 59). The portions of the contact-retaining element E adjacent the passages 94 not only serve the compartmentalization function of separating and dividing the upper contact portions 12 from one another (thereby preventing short circuits from forming as the upper contact portions 12 are deformed by the pressure of the chip 56 thereon), but also serve a stop function as the abutment of the lower surface thereof against the second stop parts 22 of the intermediate contact portions 10 limits the degree to which the contact members C can move towards the body top face 14. In other words, the upwardly facing second stop parts 22 engage the downwardly facing contact-retaining element surface from the direction of the bottom body face 18 to limit the degree to which the contact members C can move towards the body top face 14. On the other hand, once the contact-retaining element E is removed from the support body B, the second stop parts 22 are free for upwards displacement and each contact member C may be removed from the support body B especially.

Referring now to FIG. 4 in particular, assembly of a receptacle A is accomplished by first fitting one series of contact members C (preferably while the contact members C are still attached to a common bar 26) to each side of a contact-holding element D (as indicated in the lower left hand portion of FIG. 4). Note that both series of contact members C may be removed from a single supply as the dimensions and configuration of each contact member C are identical. The lower contact portions 16 should be in the innermost portions of the recesses 30 with the first stop portions 20 of the contact members C resting upon the ledges 32 of the contact-holding members D. At this point it will be noted that the lower contact portions 16 on opposite sides of the contact-holding element D are transversely aligned, with the intermediate contact portions 10 on opposite sides being offset therefrom in different lateral directions. The sub-assembly is then inserted upwardly through aperture 60 of the support body B (as indicated by the arrows associated with the sub-assembly). As the sub-assembly is inserted into aperture 60, the projections 62 of the support body B enter into recesses 30 of the contact-holding elements D and force the intermediate portions 10 snugly against the sides of the contact-holding element D. The tabs 42 of the contact-holding element D eventually abut against the ledge 64 of the support body B to preclude further insertion of the sub-assembly. At this point the contact members C are restrained from downward movement, but are able to move upwardly. Then contact-retaining element E is fitted onto support B from the top thereof (as indicated by the arrow associated therewith in FIG. 4), with ridges 74 entering outer grooves 84, posts 78 entering slot 91 and inner grooves 86, stub 76 entering slot 90, and the upper contact portions 12 of contact members C' and C'' being received in passages 94'' and 94' respectively. When the contact-retaining element E is in place, the head 80 of each catch 78 snaps over its associated adjacent stub 88 of the contact-retaining element E to hold the latter in place and the bottom surface of the contact-retaining element E abuts the second stop parts 22 of the intermediate contact portion 10. At this point the contact members C are precluded from upward motion by the contact-retaining element E and from downward motion by the contact-holding element D. As the contact members C are now immobilized, common bar 26 may be removed therefrom.

Figure 8:
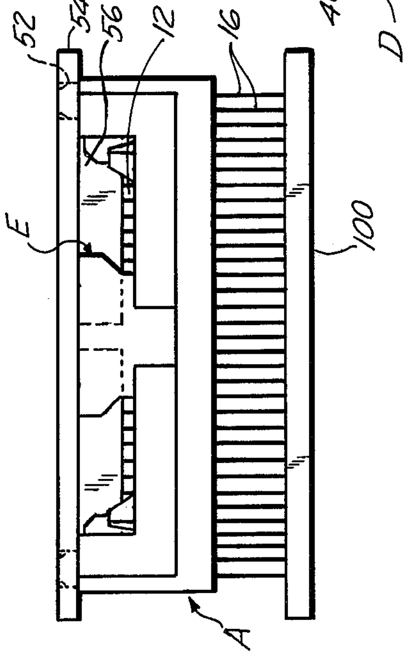
FIG. 8 is a side assembly view, to a greatly reduced scale, of the receptacle as used in connection with an integrated circuit chip and a printed circuit board.
Figure 3:
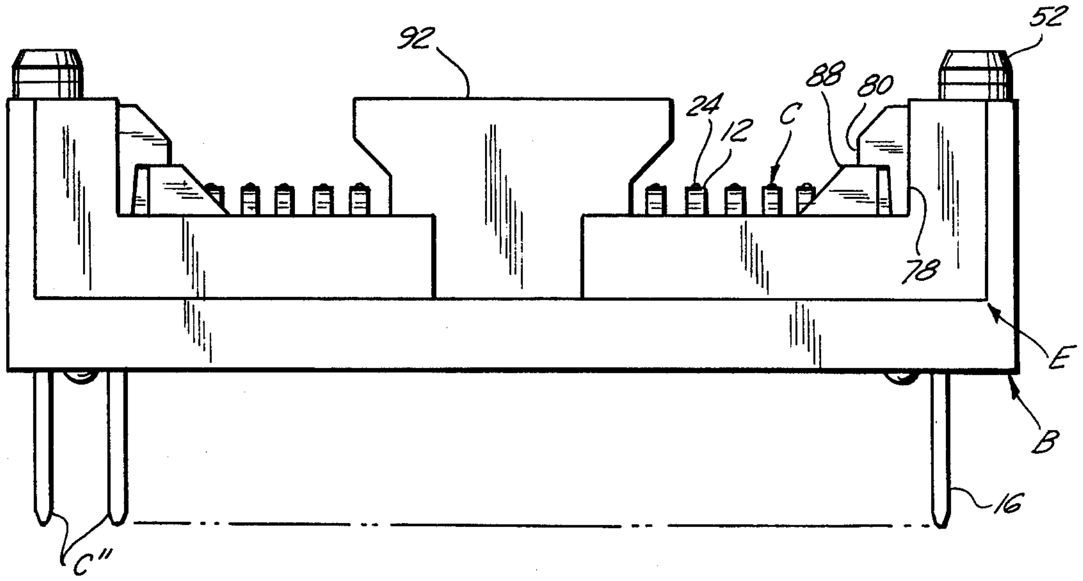
FIG. 3 is a side elevation view thereof.

Referring now to FIG. 8 in particular, in use of the receptacle A, a chip 56 is inserted atop the chip receiving station 50 with the exposed connection pads of the chip 56 resting on respective teats 24 of the contact members C. The chip 56 is typically carried by a plate 54, the plate being provided with suitable apertures to enable the plate 54 to be mounted on lugs 52. The lower contact portions are then soldered or otherwise secured to an external circuit (e.g., circuit board 100) to electrically connect the chip 56 to the external circuit.

In the event that a contact member C becomes defective, the lower contact portion 16 thereof is removed (i.e., unsoldered) from the printed circuit board 100, and the chip-bearing plate 54 is disengaged from post 52, thereby removing the chip 56 from the chip-receiving station 50. Catch members 78 are then displaced from stubs 88 and the contact-retaining element E associated with the defective contact member C is pulled away from the support body B by means of handle 92. Next the individual defective contact member C is replaced and the contact-retaining element E is remounted on support body B. Finally the chip 56 is returned to the chip-receiving station 50 (with the plate being refastened to lugs 52), and the lower contact portion 16 of the replacement contact member C soldered to the appropriate contact of the printed circuit board 100. (Actually it is immaterial whether the replacement contact member's lower portion 16 is soldered to the printed circuit board 100 before or after the chip 56 is returned to the chip-receiving station 50.) It will be recognized that while the replacement process requires a temporary separation of the chip 56 from the receptacle A and the other contact members C, it is not necessary for the other contact members to be separated from the printed circuit 100.

With the exception of the resilient conductive contact members which are formed of metal, the entire receptacle may be manufactured easily from inexpensive insulative plastic.

To summarize, the present invention provides a receptacle for connecting a chip to an external circuit which enables replacement of a defective contact member of the receptacle without disturbing the other contact members. Furthermore, the receptacle enables the contact members to be disposed in close spatial orientation to accommodate the closeness of the connection pads on the external circuit, all without use of either especially narrow contact members or contact members of different configurations and dimensions in a single receptacle. Finally, the receptacle provides a high degree of compartmentalization for each of the contact members (and especially the upper contact portions thereof) to minimize the occurrence of short circuits therebetween. The receptacle is relatively inexpensive and easy to manufacture, yet compact, sturdy and durable in use.

Now that the preferred embodiments of the present invention have been shown and described in detail, various improvements and modifications thereof will become readily apparent to those skilled in the art. Accordingly, the spirit and scope of the present invention is to be limited only by the appended claims, and not by the foregoing specification.

I claim:

1. A receptacle for a circuit chip having a plurality of exposed connection pads spaced from one another, comprising:

(A) a support body having opposite faces, a chip-receiving station on one face thereof, and an aperture extending through said body to the other face thereof from said chip-receiving station in the vicinity of said chip-carried connection pads when said chip is at said chip-receiving station;

(B) a contact-holding element removably secured to said body and defining a plurality of spaced contact-receiving first passages in communication with said aperture;

(C) a plurality of contact members adapted to be associated with said receptacle, each of said members having a first contact portion extending at least partially through one of said first passages, a second contact portion extending from said first contact portion to said one body face and there exposed at said chip-receiving station to engage and make electrical connection with a given one of said chip-carried connection pads, and a third contact portion extending from said first contact portion to said other body face and there exposed for the making of an external connection thereto, said contact member having a first stop part engaging said contact-holding element from the direction of said one body face, thereby limiting the degree to which said contact member can move toward said other body face; and (D) a contact-retaining element removably mounted on said body at said one body face thereof and having second passages in which said second contact portions are received, each of said contact members having a second stop part engaging said contact-retaining element from the direction of said other body face, thereby limiting the degree to which said contact member can move toward said one body face.

2. The receptacle of claim 1 wherein said contact-holding element is received within said body aperture.

3. The receptacle of claim 2 wherein said contact-holding element has a plurality of laterally extending recesses, and wherein said support body has a plurality of projections extending laterally into said aperture and received within said recesses, respectively, said recesses being larger than said projections and said first passages being defined by the spaces between said projections and said recesses.

4. The receptacle of claim 3 wherein said third contact portions are snugly received in said first passages.

5. The receptacle of claim 3 wherein said first stop part comprises a downwardly facing surface of said contact member, and said second stop part comprises an upwardly facing surface thereof.

6. The receptacle of claim 1 wherein said first stop part comprises a downwardly facing surface of said contact member, and said second stop part comprises an upwardly facing surface thereof.

7. The receptacle of claim 1 wherein said first stop part comprises a downwardly facing surface of said first contact portion and said second stop part comprises an upwardly facing surface thereof.

8. The receptacle of claim 1 wherein said second passages extend toward said chip-receiving station, and said second contact portions are received in said second passages and there movable in a first direction in which said second passages extend.

9. The receptacle of claim 8 wherein said second contact portions are relatively snugly received in said second passages in a second direction at right angles to said first direction, thereby to provide lateral support to said second contact portions.

10. The receptacle of claim 9 wherein said contact-retaining element defines at least in part said chip-receiving station.

11. The receptacle of claim 1 wherein said contact-retaining element defines at least in part said chip-receiving station.

12. The receptacle of claim 8 wherein said second passages terminate and are exposed at said chip-receiving station.

13. The receptacle of claim 10 wherein said second passages terminate and are exposed at said chip receiving station.

14. The receptacle of claim 1 wherein said second and third contact portions are relatively laterally offset and the axes of said second passages are correspondingly laterally offset from the axes of said first passages.

15. The receptacle of claim 1 wherein said contact-holding element has a plurality of said recesses on each of a pair of opposite sides thereof, said recesses on one side being at least partially laterally offset from said recesses on the opposite side.

16. The receptacle of claim 15 wherein said second and third contact portions extend from said first contact portion in laterally staggered orientation with said first and second stop portions being at least partially aligned longitudinally with said second and third contact portions, respectively.

17. The receptacle of claim 16 wherein said second and third contact portions are laterally thinner than said first contact portion.

18. The receptacle of claim 15 wherein said contact members in said recesses on said opposite sides of said contact-holding element have their second portions laterally displaced from their third contact portions in opposite directions and their third contact portions at least substantially transversely aligned.

19. The receptacle of claim 18 wherein said contact members on opposite sides of said contact-holding element are of substantially identical configuration and dimensions.

20. The receptacle of claim 15 wherein said second passages are deep enough to receive and accommodate said second contact portions.

21. The receptacle of claim 1 wherein said second and third contact portions extend from said first contact portion in laterally staggered orientation.

22. The receptacle of claim 21 wherein said second and third contact portions are relatively laterally offset and the axes of said second passages are correspondingly laterally offset from the axes of said first passages.

23. The receptacle of claim 22 wherein said second and third contact portions extend from said first contact portion in laterally staggered orientation with said first and second stop portions being at least partially aligned longitudinally with said second and third contact portions, respectively.

24. The receptacle of claim 1 wherein said second and third contact portions extend from said first contact portion in laterally staggered orientation with said first and second stop portions being at least partially aligned longitudinally with said second and third contact portions, respectively.

25. The receptacle of claim 21 wherein said contact members on opposite sides of said contact-holding element are identical in configuration and dimensions, have said third contact portions at least substantially transversely aligned, and said first contact portions offset from said second portions in opposite directions, thereby to allow an overlapping of said contact members on opposite sides of said contact-holding element and hence a close lateral spacing of said second contact portions.

26. The receptacle of claim 1 wherein said first stop part engages said contact-holding element of said receptacle.

27. The receptacle of claim 26 wherein said first stop part comprises a downwardly facing surface of said first contact portion and said second stop part comprises an upwardly facing surface thereof.

28. A receptacle for a circuit chip having a plurality of exposed connection pads spaced from one another, comprising:

(A) a support body having opposite faces, a chip-receiving station on one face thereof, and an aperture extending through said body to the other face thereof from said chip-receiving station in the vicinity of said chip-carried connection pads when said chip is at said chip-receiving station;

(B) a contact-holding element secured to said body and defining a plurality of spaced contact-receiving first passages in communication with said aperture, said contact-holding element having a plurality of said passages on each of a pair of opposite sides thereof, said passages on one side being at least partially laterally offset from said passages on the opposite side;

(C) a plurality of contact members adapted to be associated with said receptacle, each of said members having a first contact portion extending at least partially through one of said first passages, a second contact portion extending from said first contact portion to said one body face and there exposed at said chip-receiving station to engage and make electrical connection with a given one of said chip-carried connection pads, and a third contact portion extending from said first contact portion to said other body face and there exposed for the making of an external connection thereto, said contact member having a first stop part engaging said contact-holding element from the direction of said one body face, thereby limiting the degree to which said contact member can move toward said other body face; and (D) a contact-retaining element mounted on said body at said one body face thereof and having second passages in which said second contact portions are received, each of said contact members having a second stop part engaging said contact-retaining element from the direction of said other body face, thereby limiting the degree to which said contact member can move toward said one body face.

29. The receptacle of claim 28 wherein said second and third contact portions extend from said first contact portion in laterally staggered orientation with said first and second stop portions being at least partially aligned longitudinally with said second and third contact portions, respectively.

30. The receptacle of claim 29 wherein said second and third contact portions are laterally thinner than said first contact portion.

31. The receptacle of claim 28 wherein said contact members in said recesses on said opposite sides of said contact-holding element have their second portions laterally displaced from their third contact portions in opposite directions and their third contact portions at least substantially transversely aligned.

32. The receptacle of claim 31 wherein said contact members on opposite sides of said contact-holding element are of substantially identical configuration and dimensions.

33. The receptacle of claim 28 wherein said second passages are deep enough to receive and accommodate said first contact portions.

34. The receptacle of claim 28 wherein said contact is removably mounted on said body.

35. The receptacle of claim 34 wherein said contact-retaining element is removably mounted on said body.

36. A receptacle for a circuit chip having a plurality of exposed connection pads spaced from one another, comprising:

(A) a support body having opposite faces, a chip-receiving station on one face thereof, and an aperture extending through said body to the other face thereof from said chip-receiving station in the vicinity of said chip-carried connection pads when said chip is at said chip-receiving station;

(B) a contact-holding element secured to said body and defining a plurality of spaced contact-receiving first passages in communication with said aperture;

(C) a plurality of contact members adapted to be associated with said receptacle, each of said members having a first contact portion extending at least partially through one of said first passages, a second contact portion extending from said first contact portion to said one body face and there exposed at said chip-receiving station to engage and make electrical connection with a given one of said chip-carried connection pads, and a third contact portion extending from said first contact portion to said other body face and there exposed for the making of an external connection thereto, said contact member having a first stop part engaging said contact-holding element from the direction of said one body face, thereby limiting the degree to which said contact member can move toward said other body face, said second and third contact portions extending from said first contact portion in laterally staggered orientation; and (D) a contact-retaining element mounted on said body at said one body face thereof and having second passages in which said second contact portions are received, each of said contact members having a second stop part engaging said contact-retaining element from the direction of said other body face, thereby limiting the degree to which said contact member can move toward said one body face.

37. The receptacle of claim 36 wherein said second and third contact portions are relatively laterally offset and the axes of said second passages are correspondingly laterally offset from the axes of said first passages.

38. The receptacle of claim 37 wherein said first and second stop portions are at least partially aligned longitudinally with said second and third contact portions, respectively.

39. The receptacle of claim 36 wherein said first and second stop portions are at least partially aligned longitudinally with said second and third contact portions, respectively.

40. The receptacle of claim 36 wherein said contact members on opposite sides of said contact-holding element are identical in configuration and dimensions, have said third contact portions at least substantially transversely aligned, and said first contact portions offset from said second portions in opposite directions, thereby to allow an overlapping of said contact members on opposite sides of said contact-holding element and hence a close lateral spacing of said second contact portions.

* * * * *